United States Patent
Rhiger et al.

(10) Patent No.: US 11,598,673 B2
(45) Date of Patent: Mar. 7, 2023

(54) INFRARED DETECTING WITH MULTIPLE ABSORBERS IN A SENSING ELEMENT

(71) Applicant: Raytheon Company, Waltham, MA (US)

(72) Inventors: David R. Rhiger, Santa Barbara, CA (US); Edward P. Smith, Santa Barbara, CA (US); Jamal I. Mustafa, Goleta, CA (US)

(73) Assignee: Raytheon Company, Waltham, MA (US)

( * ) Notice: Subject to any disclaimer, the term of this patent is extended or adjusted under 35 U.S.C. 154(b) by 196 days.

(21) Appl. No.: 16/953,438

(22) Filed: Nov. 20, 2020

(65) Prior Publication Data

US 2022/0163397 A1   May 26, 2022

(51) Int. Cl.
| | |
|---|---|
| *G01J 5/08* | (2022.01) |
| *G01J 5/20* | (2006.01) |
| *H01L 31/101* | (2006.01) |
| *H01L 31/0304* | (2006.01) |
| *H01L 31/0352* | (2006.01) |

(52) U.S. Cl.
CPC ........... *G01J 5/0853* (2013.01); *G01J 5/20* (2013.01); *H01L 31/03046* (2013.01); *H01L 31/035236* (2013.01); *H01L 31/101* (2013.01)

(58) Field of Classification Search
CPC ..... G01J 5/0853; G01J 5/20; H01L 31/03046; H01L 31/035236; H01L 31/101
See application file for complete search history.

(56) References Cited

U.S. PATENT DOCUMENTS

| | | | |
|---|---|---|---|
| 5,559,336 A | 9/1996 | Kosai et al. | |
| 5,959,339 A | 9/1999 | Chapman et al. | |
| 9,196,769 B2 * | 11/2015 | Wei | ........................ H01L 31/101 |
| 11,158,754 B1 * | 10/2021 | Delaunay | .......... H01L 27/14652 |
| 2019/0019907 A1 * | 1/2019 | Suzuki | ............ H01L 31/035218 |

OTHER PUBLICATIONS

Morath et al., "More Accurate Quantum Efficiency Damage Factor for Proton-Irradiated, III-V-Based Unipolar Barrier Infrared Detectors;" Proceedings of IEEE Transactions on Nuclear Science, vol. 64, No. 1; Jan. 2017; 7 Pages.

Rehm et al., "Type-II Superlattices—The Fraunhofer Perspective;" Invited Paper; Proceedings of SPIE, vol. 7660, 76601G; Jan. 2010; 12 Pages.

Reine et al., "Simultaneous MW/LW Dual-Band MOVPE HgCdTe 64x64 FPAs;" Invited Paper; Part of the SPIE Conference on Infrared Detectors and Focal Plane Arrays V—SPIE vol. 3379; Apr. 1998; 14 Pages.

* cited by examiner

*Primary Examiner* — David P Porta
*Assistant Examiner* — Jeremy S Valentiner
(74) *Attorney, Agent, or Firm* — Daly, Crowley, Mofford & Durkee, LLP

(57) ABSTRACT

A sensing element of an infrared detector including a first absorber configured to form a first set of minority carriers upon receipt of an infrared flux, a collector, a first barrier disposed between the first absorber and the collector, a second absorber configured to form a second set of minority carriers upon receipt of the infrared flux, and a second barrier disposed between the second absorber and the collector. In response to a voltage being applied to the collector, the first and second set of minority carriers are collected at the collector.

20 Claims, 6 Drawing Sheets

INFRARED DETECTING WITH MULTIPLE ABSORBERS IN A SENSING ELEMENT

FIELD OF THE DISCLOSURE

The present disclosure relates to detectors, and more particularly, to infrared detectors.

BACKGROUND

Some infrared detectors include an absorber, a barrier, and a collector. The infrared detector receives an infrared flux that includes photons that are absorbed by the absorber. When a photon is absorbed, the energy of the photon is transferred to an electron, causing the electron to rise from the valence band to the conduction band, leaving a hole in the valence band, thereby creating an electron-hole pair. In one example, depending on the absorber material, either the hole or the electron becomes the minority carrier that is collected by the collector while the majority carrier is blocked from reaching the collector by the barrier.

Quantum efficiency (QE) of an infrared detector is affected by the thickness of the absorber. The thicker the absorber the more likely that a photon will be absorbed contributing to an improved QE. However, a thicker absorber may exceed a diffusion length of the minority carrier for the absorber. The diffusion length is typically defined as the average distance a carrier may travel before the carrier is recombined. For example, if a minority carrier is an electron, then the diffusion length is the average distance the electron will travel before it is recombined with a hole. The probability P that a minority carrier travels a specified distance x is equal to exp(-x/L) where L is the diffusion length as shown in a graph 10 in FIG. 1, where a curve 12 represents a diffusion length of 2 microns, a curve 14 represents a diffusion length of 4 microns, a curve 16 represents a diffusion length of 6 microns, and a curve 18 represents a diffusion length of 8 microns. Therefore, if an absorber is too thick and exceeds the diffusion length, then it is more likely that the minority carriers will recombine before reaching the collector and thereby reducing QE.

SUMMARY

In one aspect, a sensing element of an infrared detector includes a first absorber configured to form a first set of minority carriers upon receipt of an infrared flux, a collector, a first barrier disposed between the first absorber and the collector, a second absorber configured to form a second set of minority carriers upon receipt of the infrared flux, and a second barrier disposed between the second absorber and the collector. In response to a voltage being applied to the collector, the first and second set of minority carriers are collected at the collector.

In another aspect, a method includes receiving an infrared flux at a sensing element. The sensing element includes a first absorber, a collector, a first barrier disposed between the first absorber and the collector, a second absorber and a second barrier disposed between the second absorber and the collector. The method further includes connecting the first absorber and the first barrier to be electrically parallel with the second absorber and the second barrier, generating from the infrared flux a first set of minority carriers at the first absorber, generating from the infrared flux a second set of minority carriers at the second absorber, applying a voltage to the collector, and collecting the first set of minority carriers and the second set of minority carriers at the collector.

In a further aspect, a sensing element of an infrared detector includes a means for forming and collecting minority carriers from an infrared flux.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to improve quantum efficiency (QE) of an infrared detector. In particular, the techniques described herein include a sensor element (also known as a pixel) that includes two absorber layers separated by a collector. The sensor element described herein improves QE by having twice the thickness of absorber material than conventional infrared detectors to increase the probability that a photon is absorbed. The sensor element described herein also improves QE by having two separate absorbers that have thicknesses that are each at least less than the diffusion length to improve the likelihood that a minority carrier is collected.

Figure 1:
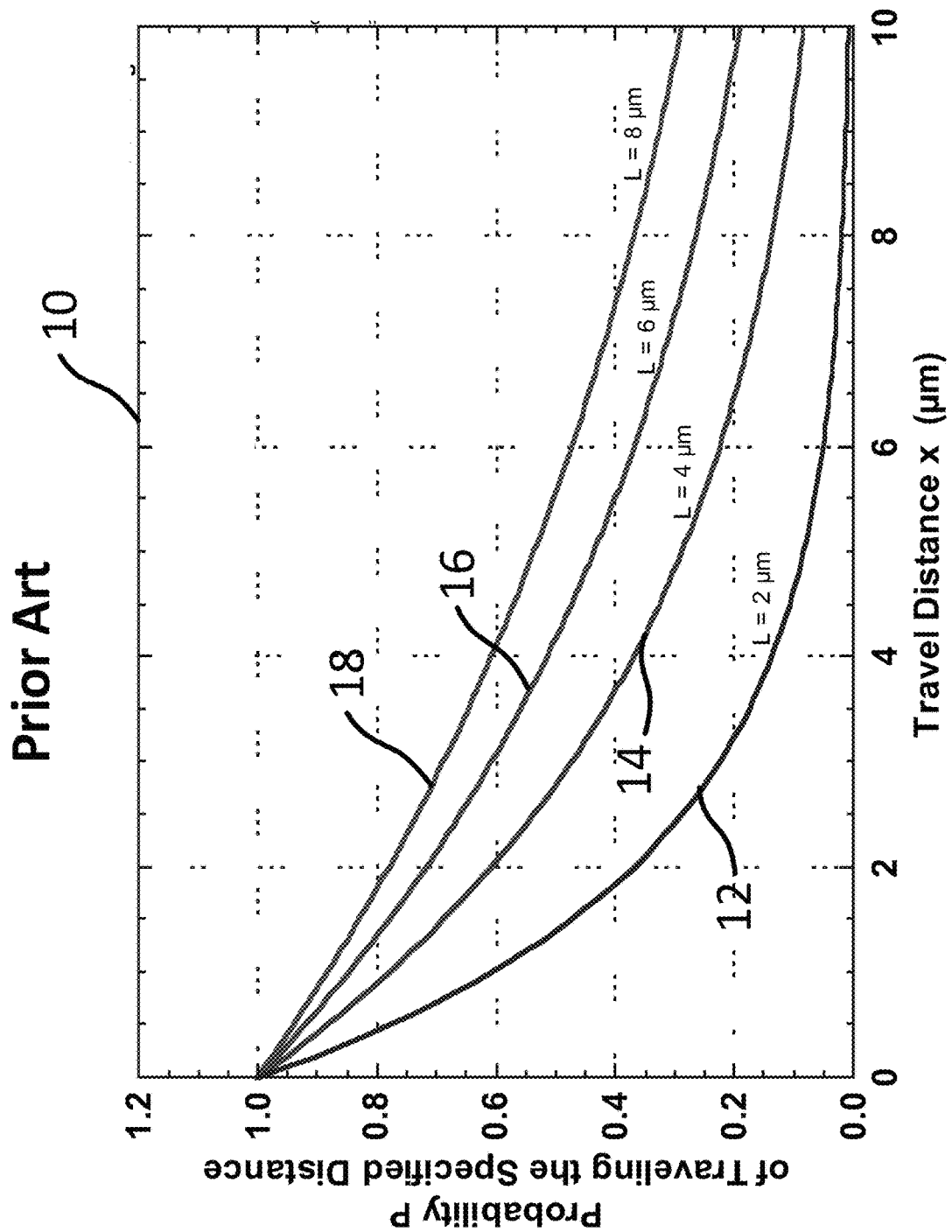
FIG. 1 is a graph of an example of a probability of a carrier traveling a specified distance based on a diffusion length.
Figure 2A:
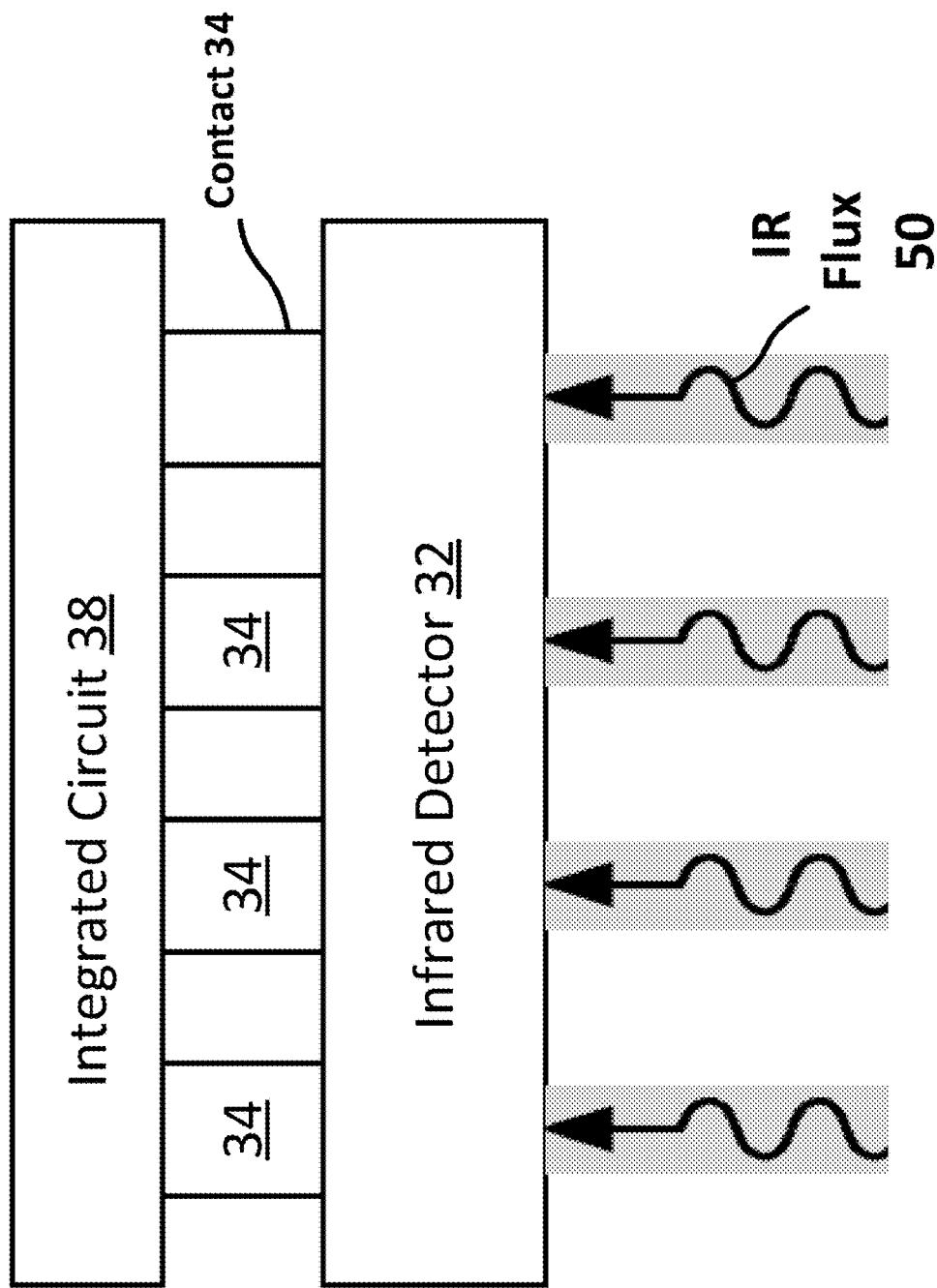
FIG. 2A is a diagram of an example of a sensor chip assembly that includes an infrared detector.
Figure 2B:
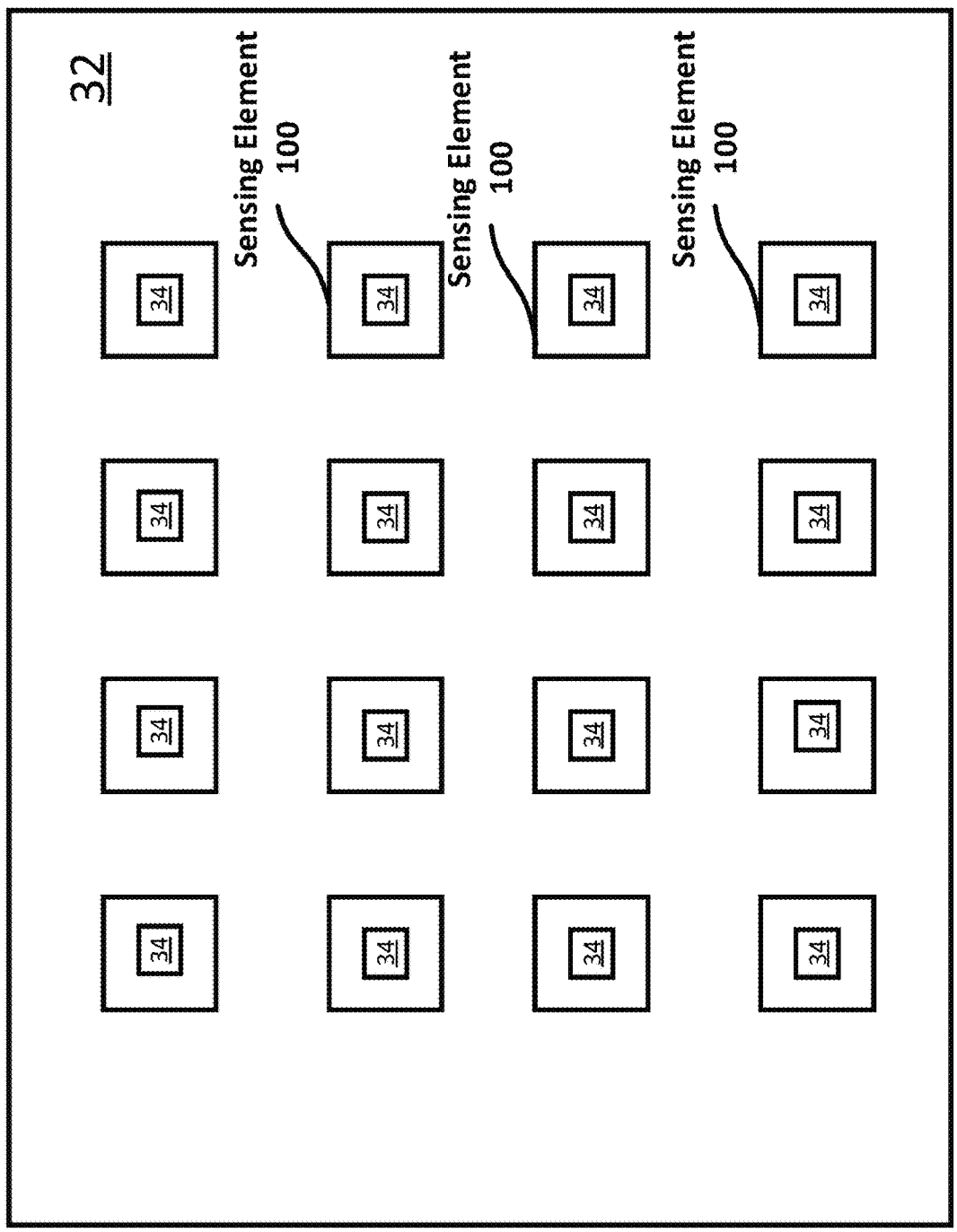
FIG. 2B is a diagram of an example of the infrared detector with an array of sensor elements.

Referring to FIGS. 2A and 2B, a sensor chip assembly 30 includes an infrared detector 32 and an integrated circuit (IC) 38. The infrared detector 32 includes an array of sensor elements 100. Each sensor element 100 includes a contact 34, which connects to a corresponding pad (not shown) on the IC 38. In one example, the contact 34 is an indium bump.

An infrared flux 50 is received by the sensor elements 100. Each of the sensor elements 100 generates a respective signal based on the infrared flux 50 that flows through their respective contact 34 to the corresponding pad (not shown) on the IC 38. The IC 38 processes the signals received by the sensor elements 100.

In one example, the sensor chip assembly 30 may be part of another device that has infrared detection features. For example, the sensor chip assembly 30 may be part of a surveillance system.

Figure 3:
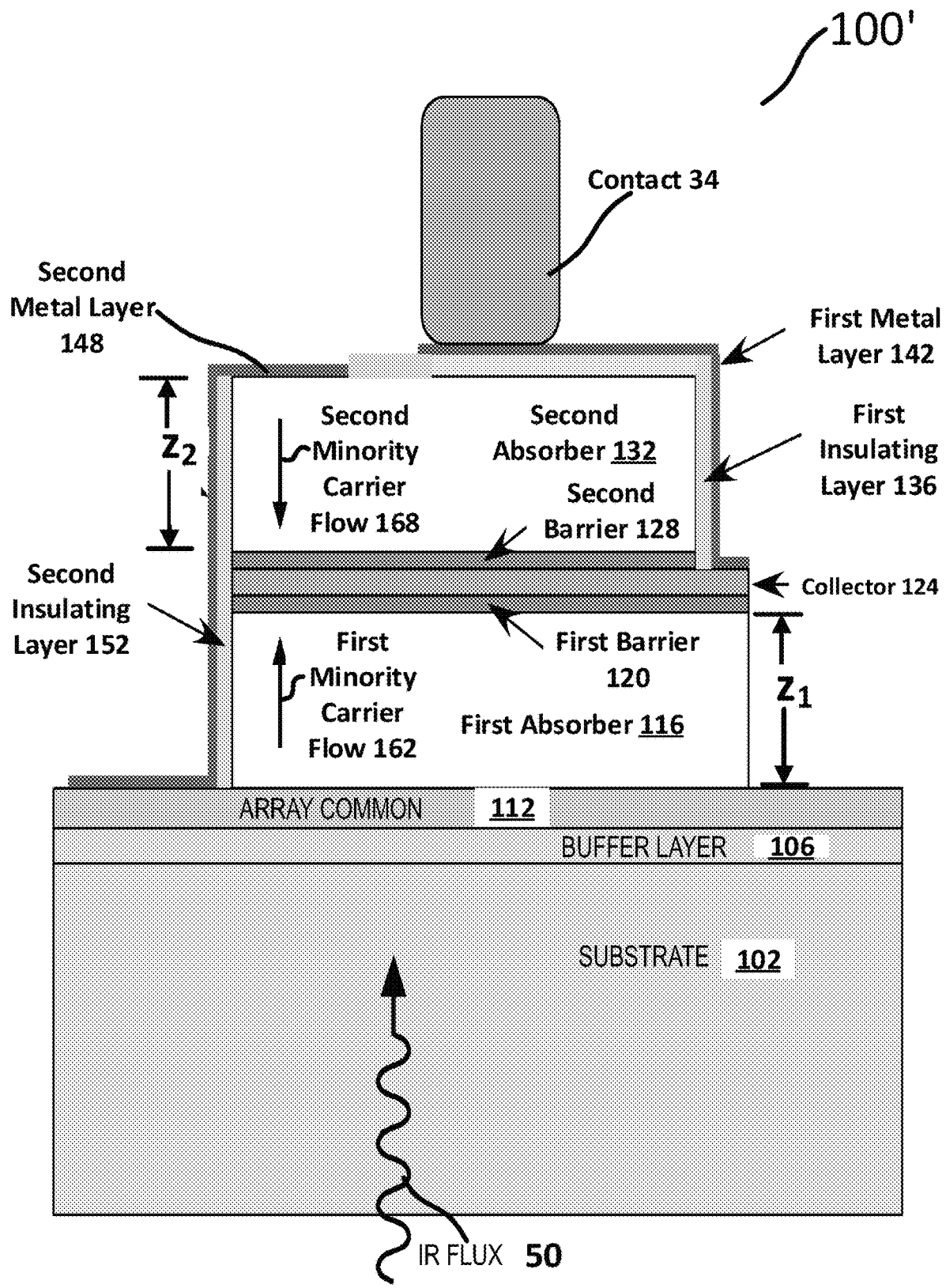
FIG. 3 is a cross-sectional diagram of an example of a sensor element.

Referring to FIG. 3, an example of a sensor element 100 is a sensor element 100'. The sensor element 100' includes a substrate 102, a buffer layer 106 on the substrate 102 and an array common 112 on the buffer layer 106.

In one example, the substrate 102 is a material that has a wide band gap. In one particular example, the substrate 102 is gallium antimonide (GaSb). In one particular example, the buffer layer 106 is GaSb. In one particular example, the buffer layer 106 is grown to cover surface defects of the substrate 102 before the electrically active layers.

The array common 112 connects to other sensing elements in the infrared detector 32 (FIG. 2B). In one example, the array common 112 may be the same material as the first absorber 116 and/or the second absorber 132 but more highly doped. For example, if the first and second absorbers 116, 132 are both n-type doped, then the array common 112 is n+-type doped. In one particular example, the array common 112 may be an indium arsenide/indium arsenide antimonide (InAs/InAsSb) superlattice structure.

The sensor element 100' also includes a first absorber 116 on the array common 112, a first barrier 120 on the first absorber 116, a collector 124 on the first barrier 120, a second barrier 128 on the collector 124 and a second absorber 132 on the second barrier 128.

In one example, the first absorber 116 may have a thickness $Z_1$ between 2 and 10 microns. In one particular example, the thickness $Z_1$ may be about 4 microns. In one example, the thickness $Z_1$ may be shorter than a minority carrier diffusion length of the first absorber 116. In one example, the first absorber 116 may be a III-V superlattice. In one particular example, the first absorber 116 may be an InAs/InAsSb superlattice structure.

In one example, the second absorber 132 may have a thickness $Z_2$ between 2 and 10 microns. In one particular example, the thickness $Z_2$ may be about 4 microns. In one example, the thickness $Z_2$ may be shorter than a minority carrier diffusion length of the second absorber 132. In one example, the second absorber 132 may be a III-V superlattice. In one particular example, the second absorber 132 may be an InAs/InAsSb superlattice structure.

In some examples, the thickness $Z_2$ may be about the same as the thickness $Z_1$. In some examples, the first and second absorbers 116, 132 may be the same material. In other examples, the first and second absorbers 116, 132 may be different material from one another, but have similar band gap properties.

In one example, the first barrier 120 has a thickness between 0.05 microns and 0.5 microns. In one example, the first barrier 120 may be a material that has a wider band gap than the first absorber 116. In one particular example, the first barrier 120 may be an aluminum gallium arsenide antimonide (AlGaAsSb) alloy. In one particular example, the first barrier 120 may be a superlattice structure.

In one example, the second barrier 128 has a thickness between 0.05 microns and 0.5 microns. In one example, the second barrier 128 may be a material that has a wider band gap than the second absorber 132. In one particular example, the second barrier 128 may be an AlGaAsSb alloy. In one particular example, the second barrier 128 may be a superlattice structure.

In one example, the collector 124 has a thickness between 0.1 microns and 0.2 microns. In one example, the collector 124 is the same material as the first absorber 116 and/or the second absorber 132 but more highly doped. For example, if the first and second absorbers 116, 132 are both n-type doped, then the collector 124 is n+-type doped. In one particular example, the collector 124 may be an indium arsenide/indium arsenide antimonide (InAs/InAsSb) superlattice structure.

A first metal layer 142 connects the contact 34 to the collector 124. A first insulating layer 136 (e.g., silicon dioxide) insulates the second barrier 128 and the second absorber 132 from the first metal layer 142.

A second metal layer 148 connects the second absorber 132 to the array common 112. The first absorber 116 and the first barrier 120 are electrically connected in parallel with the second absorber 132 and the second barrier 128. A second insulating layer 152 (e.g., silicon dioxide) insulates the first absorber 116, the first barrier 120, the collector 124, the second barrier 128 and a side portion of the second absorber 132 from the second metal layer 148.

In operation, the IR flux 50 is received at the substrate 102 and continues through the buffer 106 and through the array common 112 to the first absorber 116. Some of the photons in the IR flux 50 may be absorbed by the first absorber 116.

Those photons that are absorbed by the first absorber 116 form minority carriers that travel in a first minority carrier flow 162 towards the collector 124, which receives an applied voltage. In one particular example, the applied voltage is applied at the contact 34 and the voltage follows the first metal layer 142 (FIG. 3) to the collector 124. If a minority carrier is not recombined, then the minority carrier is collected at the collector 124.

Those photons that are not absorbed by the first absorber 116 travel to the second absorber 132. Those photons that are absorbed by the second absorber 132 form minority carriers that travel in a second minority carrier flow 168 towards the collector 124, which receives the applied voltage. If a minority carrier is not recombined, then the minority carrier is collected at the collector 124.

Figure 4:
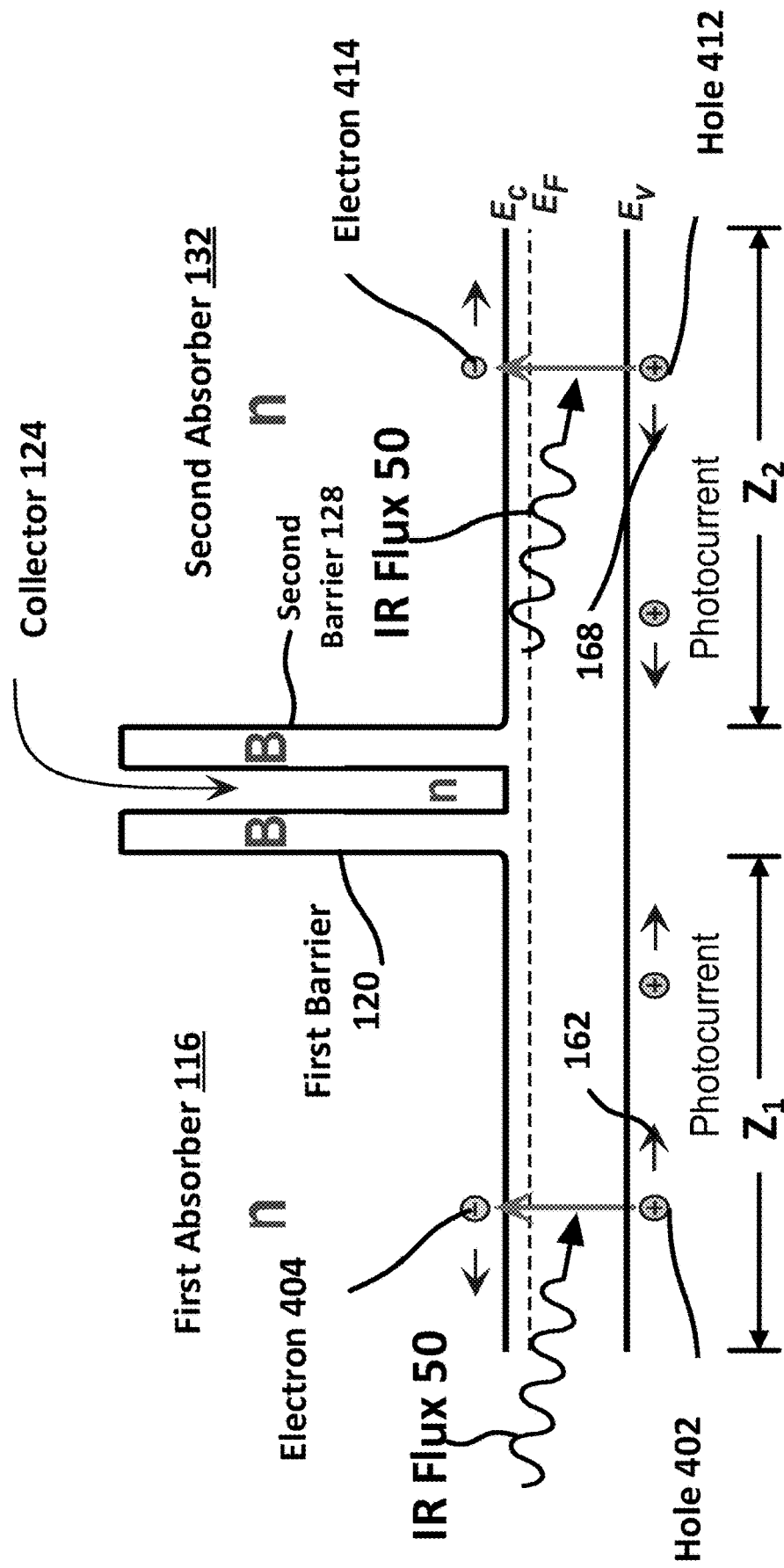
FIG. 4 is a diagram of a minority carrier process in the sensor element of FIG. 3.

Referring to FIG. 4, in one particular example, the first and second absorbers 116, 132 are n-type semiconductors so that the minority carriers are holes, and the majority carriers are electrons. In this example, the first and second absorbers 116, 132 are the same material.

The applied voltage to the conductor is a negative voltage. In one particular example, the applied voltage is between −10 mV and −100 mV relative to the array common 112.

Those photons that are absorbed by the first absorber 116 form electron/hole pairs. For example, when a photon is absorbed, the energy of the photon is transferred to an electron 404, causing the electron 404 to rise from the valence band $E_V$ to the conduction band $E_C$, leaving a hole 402 in the valence band $E_V$, thereby creating an electron-hole pair. The hole 402 moves in the direction of the first minority carrier flow 162 toward the collector 124 and the electrons move away from the collector 124 because of the negative voltage applied to the collector 124.

Those photons that are not absorbed by the first absorber 116 continue to the second absorber 132. Those photons that are absorbed by the second absorber 132 form electron/hole pairs. For example, when a photon is absorbed, the energy of the photon is transferred to an electron 414, causing the electron 414 to rise from the valence band $E_V$ to the conduction band $E_C$, leaving a hole 412 in the valence band $E_V$, thereby creating an electron-hole pair The hole 412 moves in the direction of the second minority carrier flow 168 toward the collector 124 and the electrons move away from the collector 124 because of the negative voltage applied to the collector 124.

Figure 5:
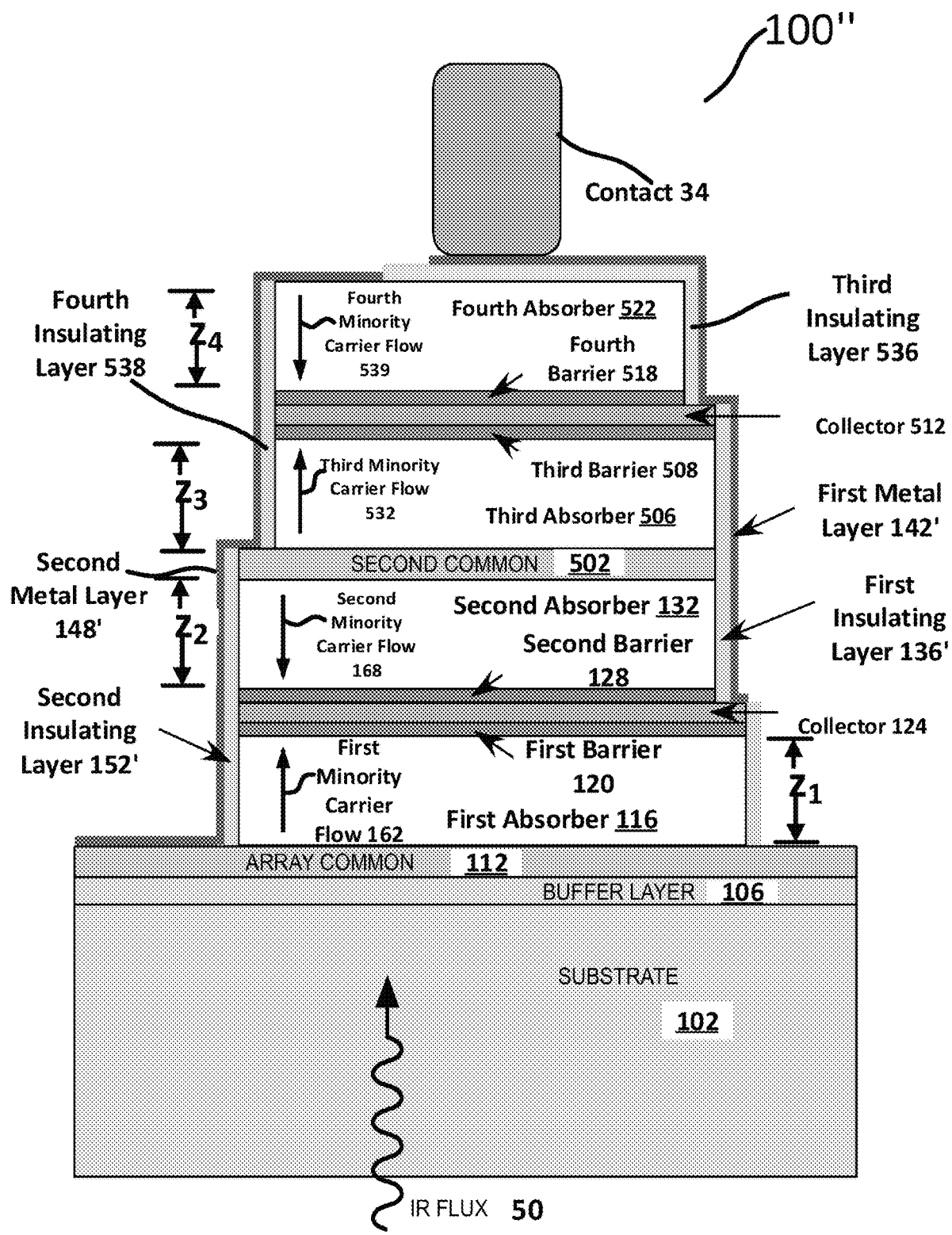
FIG. 5 is a cross-sectional diagram of another example of the sensor element.

Referring to FIG. 5, another example of the infrared detector 100 is an infrared detector 100". The infrared detector 100" includes the same elements as the infrared detector 100' but includes an additional absorber-collector-absorber combination.

In particular, the infrared detector 100" includes a second common 502 on the second absorber 132, a third absorber 506 on the second common 502, a third barrier 508 on the third absorber 506, a collector 512 on the third barrier 508, a fourth barrier 518 on the collector 512 and a fourth absorber 522 on the fourth barrier 518.

In one example, the second common 502 may be the same material as the third absorber 506 and/or the fourth absorber 522 but more highly doped. For example, if the third and fourth absorbers 506, 522 are both n-type doped, then the second common 502 is n+-type doped. In one particular example, the second common 502 may be an indium arsenide/indium arsenide antimonide (InAs/InAsSb) superlattice structure.

In one example, the third absorber 506 may have a thickness $Z_3$ between 2 and 10 microns. In one particular example, the thickness $Z_3$ may be about 4 microns. In one example, the thickness $Z_3$ may be shorter than a minority carrier diffusion length of the third absorber 506. In one example, the third absorber 506 may be a III-V superlattice. In one particular example, the third absorber 506 may be an InAs/InAsSb superlattice structure.

In one example, the fourth absorber 522 may have a thickness $Z_4$ between 2 and 10 microns. In one particular example, the thickness $Z_4$ may be about 4 microns. In one example, the thickness $Z_4$ may be shorter than a minority carrier diffusion length of the fourth absorber 522. In one example, the fourth absorber 522 may be a III-V superlattice. In one particular example, the fourth absorber 522 may be an InAs/InAsSb superlattice structure.

In some examples, the thickness $Z_4$ may be about the same as the thickness $Z_3$. In some examples, the third and fourth absorbers 506, 522 may be the same material. In other examples, the third and fourth absorbers 506, 522 may be different material from one another, but have similar band gap properties.

In some examples, the thicknesses $Z_1$, $Z_2$, $Z_3$, $Z_4$ may be about the same. In some examples, the first, second, third and fourth absorbers 116, 132, 506, 522 may be the same material.

In one example, the third barrier 508 has a thickness between 0.05 microns and 0.5 microns. In one example, the third barrier 508 may be a material that has a wider band gap than the third absorber 506. In one particular example, the third barrier 508 may be an AlGaAsSb alloy. In one particular example, the third barrier 508 may be a superlattice structure.

In one example, the fourth barrier 518 has a thickness between 0.05 microns and 0.5 microns. In one example, the fourth barrier 518 may be a material that has a wider band gap than the fourth absorber 522. In one particular example, the fourth barrier 518 may be an AlGaAsSb alloy. In one particular example, the fourth barrier 518 may be a superlattice structure.

In one example, the collector 512 has a thickness between 0.1 microns and 0.2 microns. In one example, the collector 512 is the same material as the third absorber 506 and/or the fourth absorber 522 but more highly doped. For example, if the first and second absorbers 506, 522 are both n-type doped, then the collector 512 is n+-type doped. In one particular example, the collector 512 may be an indium arsenide/indium arsenide antimonide (InAs/InAsSb) superlattice structure.

A first metal layer 142' connects the contact 34 to the collector 124 and to the collector 512. A first insulating layer 136' (e.g., silicon dioxide) insulates the second barrier 128, the second absorber 132, the second common 502, the third absorber 506 and the third barrier 508 from the first metal layer 142'. A third insulating layer 536 (e.g., silicon dioxide) insulates the fourth barrier 518 and the fourth absorber 522 from the first metal layer 142'.

A second metal layer 148' connects the fourth absorber 522 to the second common 502 and to the array common 112. The third absorber 506 and the third barrier 508 are electrically connected in parallel with the fourth absorber 522 and the fourth barrier 518. A second insulating layer 152' (e.g., silicon dioxide) insulates the first absorber 116, the first barrier 120, the collector 124, the second barrier 128 and the second absorber 132 from the second metal layer 148. A fourth insulating layer 538 (e.g., silicon dioxide) insulates the third absorber 506, the third barrier 508, the collector 512, the fourth barrier 518 and a side portion of the fourth absorber 522 from the second metal layer 148'.

The sensor element 100" processes the IR flux 50 similarly as the sensor element 100'. In addition, those photons that are not absorbed by the second absorber 132 travel to the third absorber 506. Those photons that are absorbed by the third absorber 506 form minority carriers that travel in a third minority carrier flow 532 towards the collector 512, which receives the applied voltage. For example, the applied voltage is applied to the contact 34 and the voltage follows the first metal layer 142' to the collector 512. If a minority carrier is not recombined, then the minority carrier is collected at the collector 512.

Those photons that are not absorbed by the third absorber 506 travel to the fourth absorber 522. Those photons that are absorbed by the fourth absorber 522 form minority carriers that travel in a fourth minority carrier flow 539 towards the collector 512. If a minority carrier is not recombined, then the minority carrier is collected at the collector 512.

The techniques described herein are not limited to the specific examples described. For example, the sensor element may include more absorber-collector-absorber combinations than described herein.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A sensing element of an infrared detector comprising:
   a first absorber configured to form a first set of minority carriers upon receipt of an infrared flux;
   a collector;
   a first barrier disposed between the first absorber and the collector;
   a second absorber configured to form a second set of minority carriers upon receipt of the infrared flux;
   a second barrier disposed between the second absorber and the collector;
   a first metal layer extending across a top surface of the second absorber, continuing down a first sidewall of the second absorber and connecting with the collector;
   a first insulating layer separating the first metal layer from the second absorber, the first insulating layer extending across the top surface of the second absorber, continuing down the first sidewall of second absorber and connecting with the collector;
   a contact in direct contact with the first metal layer;
   an array common in direct contact with the first absorber;
   a second metal layer in direct contact with the top surface of the second absorber, the second metal layer extending across the top surface of the second absorber, continuing down a second sidewall of the second absorber, continuing down sidewalls of the second barrier, the collector and the first absorber and connecting with the array common; and a second insulating layer separating the second metal layer from the first absorber, the second absorber, the collector, the first barrier and the second barrier, the second insulating layer extending down a second sidewall of the second absorber, extending down sidewalls of the second barrier, the collector and the first absorber and connecting with the array common, wherein, in response to a voltage being applied to the collector, the first and second set of minority carriers are collected at the collector.

2. The sensing element of claim 1, wherein the first absorber and the first barrier are electrically connected in parallel with the second absorber and the second barrier.

3. The sensing element of claim 1, wherein the first absorber and the second absorber are the same material.

4. The sensing element of claim 1, wherein a thickness of the first absorber is less than a minority carrier diffusion length of the first absorber.

5. The sensing element of claim 4, wherein a thickness of the second absorber is less than a minority carrier diffusion length of the second absorber.

6. The sensing element of claim 5, wherein the thickness of the first absorber is equal to a thickness of the second absorber.

7. The sensing element of claim 1,
wherein the voltage is applied at the contact.

8. The sensing element of claim 7, wherein the contact is an indium bump.

9. The sensing element of claim 1, further comprising:
a substrate; and
a buffer layer disposed between the array common and the substrate.

10. The sensing element of claim 1, wherein the voltage being applied to the collector is a negative voltage.

11. The sensing element of claim 10, wherein the first set of minority carriers and the second set of minority carriers are holes.

12. A sensing element of an infrared detector comprising:
a first absorber configured to form a first set of minority carriers upon receipt of an infrared flux;
a first collector;
a first barrier disposed between the first absorber and the first collector;
a second absorber configured to form a second set of minority carriers upon receipt of the infrared flux; and
a second barrier disposed between the second absorber and the first collector,
a third absorber configured to form a third set of minority carriers upon receipt of the infrared flux;
a second collector;
a third barrier disposed between the third absorber and the second collector;
a fourth absorber configured to form a fourth set of minority carriers upon receipt of the infrared flux; and
a fourth barrier disposed between the fourth absorber and the second collector,
wherein, in response to a voltage being applied to the first collector, the first and second set of minority carriers are collected at the first collector,
wherein, in response to a voltage being applied to the second collector, the third and fourth set of minority carriers are collected at the second collector,
wherein the first collector and the second collector are connected by a metal layer.

13. The sensing element of claim 12, wherein the third absorber and the third barrier are electrically connected in parallel with the fourth absorber and the fourth barrier.

14. The sensing element of claim 13, wherein the voltage being applied to the second collector is a negative voltage, and
wherein the third set of minority carriers and the fourth set of minority carriers are holes.

15. The sensing element of claim 12, wherein the first absorber and the first barrier are electrically connected in parallel with the second absorber and the second barrier.

16. The sensing element of claim 12, wherein the first absorber and the second absorber are the same material.

17. The sensing element of claim 12, wherein a thickness of the first absorber is less than a minority carrier diffusion length of the first absorber, and
wherein a thickness of the second absorber is less than a minority carrier diffusion length of the second absorber.

18. A method comprising:
receiving an infrared flux at a sensing element, wherein the sensing element comprises:
a first absorber;
a first collector;
a first barrier disposed between the first absorber and the first collector;
a second absorber; and
a second barrier disposed between the second absorber and the first collector;
a third absorber;
a second collector;
a third barrier disposed between the third absorber and the second collector;
a fourth absorber; and
a fourth barrier disposed between the fourth absorber and the second collector;
connecting the first absorber and the first barrier to be electrically parallel with the second absorber and the second barrier;
generating from the infrared flux a first set of minority carriers at the first absorber;
generating from the infrared flux a second set of minority carriers at the second absorber;
applying a voltage to the first collector; and
collecting the first set of minority carriers and the second set of minority carriers at the first collector,
connecting the third absorber and the third barrier to be electrically parallel with the fourth absorber and the fourth barrier;
generating from the infrared flux a third set of minority carriers at the third absorber;
generating from the infrared flux a fourth set of minority carriers at the fourth absorber;
applying the voltage to the second collector; and
collecting the third set of minority carriers and the fourth set of minority carriers at the second collector; and
providing an electrical connection between the first collector and the second collector.

19. The method of claim 18, further comprising:
providing the first absorber with a first thickness; and
providing the second absorber with a second thickness,
wherein the first thickness is smaller than a minority carrier diffusion length of a material of the first absorber,
wherein the second thickness is smaller than a minority carrier diffusion length of a material of the second absorber.

20. The method of claim 19, wherein providing the second absorber with a second thickness comprises providing the second absorber with a second thickness equal to the first thickness,
wherein the first absorber and the second absorber are the same material.

* * * * *